United States Patent
Cho

[19]

[11] Patent Number: 5,804,509
[45] Date of Patent: Sep. 8, 1998

[54] VARYING TEOS FLOW RATE WHILE FORMING INTERMETALLIC INSULATING LAYERS IN SEMICONDUCTOR DEVICES

[75] Inventor: Gyung-Su Cho, Kyoungki-do, Rep. of Korea

[73] Assignee: Hyundai Electronics Industries Co., Ltd., Ich'on, Rep. of Korea

[21] Appl. No.: 610,715

[22] Filed: Mar. 4, 1996

[30]   Foreign Application Priority Data

Mar. 4, 1995  [KR]  Rep. of Korea .................... 1995/4445

[51] Int. Cl.⁶ .................................................. H01L 00/00
[52] U.S. Cl. ............................................................ 438/790
[58] Field of Search ..................... 437/235, 238

[56]          References Cited
           U.S. PATENT DOCUMENTS 5,051,380  9/1991  Maeda et al. ........................ 437/238
5,271,972 12/1993  Kwok et al. ........................ 427/579

*Primary Examiner*—Charles L. Bowers, Jr.
*Assistant Examiner*—Matthew Whipple
*Attorney, Agent, or Firm*—Ware, Fressola, Van Der Sluys & Adolphson LLP

[57]           ABSTRACT

Method of forming intermetallic insulating layers in semiconductor devices are disclosed, which not only have superior adhesion and homogeneous step coverage but also prevent the generation of voids due to the penetration of moisture. According to the method, metal interconnects are, first formed on the semiconductor substrate. Thereafter, a first insulating layer is formed to a thickness capable of sufficiently filling the spaces between the metal interconnects by reacting Tetraethylorthosilicate(TEOS) gas of a predetermined flow rate with $O_3$ gas of a predetermined density in a CVD furnace. Next, a second insulating layer of a predetermined thickness is formed on the first insulating layer using the same furnace but by changing only the flow rate of TEOS.

8 Claims, 4 Drawing Sheets

FIG. 1B

| TEMP.(°C) | TEOS FLOW (slpm) | O3 CONC. (g/m3) | DEP. TIME(sec) | R-NO. | THICKNESS (Å) | UNIFORMITY (%) | STRESS(dynes/cm2) AS-DEP. | STRESS(dynes/cm2) PASS 96HRS | STRESS(dynes/cm2) CHANGE(%) | ANNEAL (420°C,30') | THICKNESS SHRINKAGE(%) |
|---|---|---|---|---|---|---|---|---|---|---|---|
| 360 | 1.3 | 70 | 419 | 3 | 5993 | 1.97 | 2.293E9 | 5.659E8 | 17.3 | 1.968E9 | 1.60 |
| | | 100 | 457 | 3 | 6187 | 2.39 | 2.775E9 | 6.295E8 | 21.5 | 2.060E9 | 1.23 |
| | | 130 | 459 | 3 | 6019 | 1.49 | 2.559E9 | 5.871E8 | 19.7 | 1.952E9 | 1.86 |
| 390 | 1.3 | 100 | 528 | 3 | 5997 | 1.57 | 2.803E9 | 9.776E8 | 18.3 | 1.788E9 | 0.52 |
| | 2.3 | | 339 | 3 | 6260 | 2.09 | 3.247E9 | 9.102E8 | 23.4 | 2.096E9 | 1.20 |
| | 3.3 | | 235 | 4 | 5848 | 0.89 | 3.017E9 | 7.813E8 | 22.4 | 2.014E9 | 1.50 |
| 420 | 1.3 | 70 | 622 | 4 | 5668 | 1.80 | 2.498E9 | 1.071E9 | 1.4 | 1.539E9 | 0.35 |
| | | 100 | 662 | 4 | 5610 | 2.20 | 2.444E9 | 1.157E9 | 1.3 | 1.557E9 | 0.12 |
| | | 130 | 738 | 4 | 5960 | 2.57 | 2.517E9 | 1.256E9 | 1.3 | 1.644E9 | 0.52 |
| 390 | 1.3 | 130 | 920 | 3/4 | 10092 | 1.70 | – | – | – | – | – |

| TEMP.(°C) | TEOS FLOW (slpm) | O3 CONC. (g/m3) | DEP.RATE (Å/min) | R.I. AS-DEP. | R.I. ANNEAL (420°C,30') | PLANARITY (degree) | CONFORMALITY (%) |
|---|---|---|---|---|---|---|---|
| 360 | 1.3 | 70 | 858 | 1.37 | 1.36 | – | – |
| | | 100 | 812 | 1.40 | 1.40 | 53 | 30 |
| | | 130 | 787 | 1.34 | 1.32 | – | – |
| 390 | 1.3 | 100 | 681 | 1.35 | 1.36 | 50 | 41 |
| | 2.3 | | 1108 | 1.41 | 1.41 | 50 | 41 |
| | 3.3 | | 1493 | 1.36 | 1.37 | – | – |
| 420 | 1.3 | 70 | 547 | – | 1.55 | 57 | 20 |
| | | 100 | 508 | – | 1.62 | 59 | 10 |
| | | 130 | 485 | 1.37 | 1.37 | 52 | 30 |
| 390 | 1.3 | 130 | 658 | 1.44 (UNI.=1.7%) | – | 35 | 48 |

VARYING TEOS FLOW RATE WHILE FORMING INTERMETALLIC INSULATING LAYERS IN SEMICONDUCTOR DEVICES

SUMMARY OF THE INVENTION

The present invention relates to methods of forming semiconductor devices, and more particularly to methods of forming intermetallic insulating layers in semiconductor devices having metal interconnects of multi-level structure.

DESCRIPTION OF THE PRIOR ART

As the integration of semiconductor devices becomes ever increasing, a semiconductor device having a metal interconnect of multiple layers is required. In fabricating the semiconductor device, spaces between metal lines of each layer and the space between two layers should be insulated by an intermetallic insulating layer of dielectric materials such as oxide or nitride. Intermetallic insulating layers of high quality need: resistance against water; high adhesion to the metal interconnect; and homogeneous step coverage. Currently, dielectric materials such as Borophosphosilicate glass(BPSG), Spin on glass(SOG), and Tetraethylorthosilicate(TEOS) have been used as intermetallic insulating layers.

When BPSG is used as the intermetallic insulating layer, it needs an additional reflow process. Accordingly, it has a problem in that voids are formed at inner predetermined positions of the layer. Meanwhile, when SOG is used as the insulating layer, it leads to a corrosion of the metal interconnects due to the penetration of moisture. The reason being, the layer itself possesses a large quantity of moisture and its adhesion with the metal layer is also poor.

In addition to above materials, a method which uses TEOS film as the insulating layer, has been proposed. The method reacts Tetraethylorthosilicate(TEOS) gas with $O_3$ gas to form the TEOS film. In using this method, it is easy to fill the spaces between the metal lines because the TEOS film increases the effect of the surface reaction, but the formed TEOS film includes a large quantity of moisture and the layer itself may also directly absorb moisture from the atmosphere. Hydrogen radicals present in the moisture penetrate to the surface of the metal interconnect, resulting in stress variations of the formed layer. If the variation is severe, the formed layer is broken at the predetermined thickness.

SUMMARY OF THE INVENTION

Accordingly, the object of the present invention is to provide methods of forming intermetallic insulating layers in semiconductor devices, which not only have superior adhesion and homogeneous step coverage but also prevent the generation of voids due to the penetration of moisture.

To accomplish the object of the invention, a metal interconnect is first formed on the semiconductor substrate. Thereafter, a first insulating layer is formed to a thickness capable of sufficiently filling the spaces between lines of the metal interconnect in one layer. The insulating layer, itself, is formed by reacting Tetraethylorthosilicate gas of a selected standard volume flow rate with $O_3$ gas of predetermined concentration (mass density) in a CVD furnace. Next, a second insulating layer of a predetermined thickness is formed on the first insulating layer using the same furnace, but varying the volume flow rate of TEOS.

It is preferable to form the first insulating layer with an $O_3$ concentration of 3.0 to 5.0 mol wt %, a deposition temperature of 360° to 420° C., and a TEOS volume flow rate of 1.0 to 2.0 slpm. Furthermore, it is preferable to form the second insulating layer with an $O_3$ concentration of 3.0 to 5.0 mol wt %, a deposition temperature of 360° to 420° C., and a TEOS, volume flow rate of less than 1.0 to 2.0 slpm.

It is also preferred for the thickness of the first insulating layer be 6,000 Å or higher and the thickness of the second insulating layer be 1,000 Å or lower. Physical properties. Accordingly, a mass density of $O_3$ of 130 g/m³ is excluded from the most appropriate range.

BRIEF DESCRIPTION OF THE DRAWINGS

FIG. 1B is a table showing results of an experiment to measure the physical properties of the formed TEOS film in order to search for the most appropriate conditions for forming a first insulating layer.

DETAILED DESCRIPTION OF THE PRESENT INVENTION

Figure 1A:
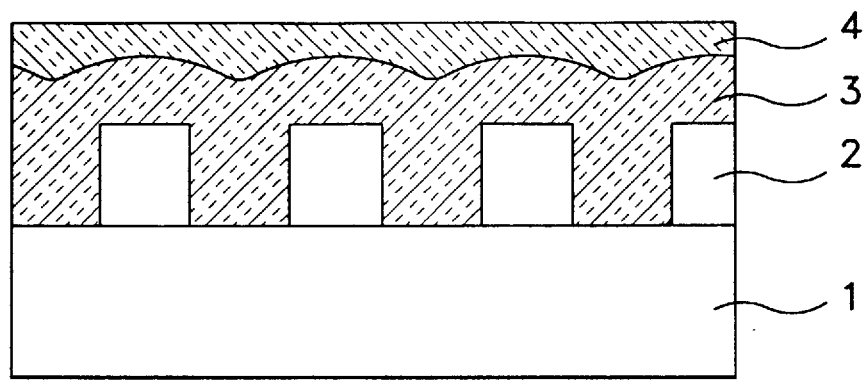
FIG. 1A shows a semiconductor device with an intermetallic insulating layer formed according to the present invention.

Hereinbelow, a preferred embodiment of the present invention is described, but it should not be construed as limiting the spirit scope of the present invention.

Insulating layers according to the present invention for insulating metal interconnects are divided into two parts. In other words, there is a first insulating layer for completely filling spaces between metal lines in a metal interconnect of one layer, and a second insulating layer for covering the metal interconnect and the first insulating layer. The two layers have different properties due to their respective formations.

Hereinbelow, the present invention is described in more detail in conjunction with FIG. 1A.

First a metal interconnect is formed through the deposition and patterning of a metal on a semiconductor substrate. Thereafter, a first insulating layer and a second insulating layer are sequentially formed by a Chemical Vapor Deposition method which reacts TEOS gas with $O_3$ gas.

The TEOS gas is one of the source material to form the insulating layers.

The first insulating layer is formed with an $O_3$ concentration of 3.0 to 5.0 mol wt %, a forming temperature of 360° to 420° C., and a TEOS volume flow rate of 1.0 to 2.0 slpm. It is preferred that the first insulating layer formed, completely fills the spaces between the metal lines in the metal interconnect of one layer in order to enhance or maintain the property of the semiconductor device. In this embodiment, thickness of the first insulating layer is 6,000 Å.

Next, a second insulating layer is formed to a predetermined thickness on the first insulating layer, wherein the second insulating layer has different physical properties than those of the first. It is preferable that a reaction furnace used in the formation of the first insulating layer be the same as used for that of the second insulating layer for the purpose of minimizing contact with the moisture present in the atmosphere.

The forming condition of the second insulating layer should be equally given with that of the first insulating layer except for the volume flow rate of TEOS. That is, the $O_3$ concentration of 3.0 to 5.0 mol wt % and the deposition temperature of 360° to 420° C., are the same with that of the first insulating layer, but the volume flow rate of TEOS is 0.5 slpm and below, which is lower than that of the first insulating layer. The thickness of the second insulating layer should be controlled to 1,000 Å and below.

EXAMPLE

FIG. 1B is a table showing results that measure the physical properties of the formed TEOS film in order to search for an appropriate condition for forming a first insulating layer.

To form the first insulating layer having the thickness of 6,000 Å, the forming temperature of 360°, 390°, and 420° C., the TEOS volume flow rate of 1.3, 2.3 and 3.3 slpm, and the $O_3$ mass density (concentration) of 70 g/m$^3$ (=3.27 mol wt %), 100 g/m$^3$ (=4.66 mol wt %) and 130 g/m$^3$ were given, respectively.

Under the above conditions, to obtain the ratio of stress variation, the stress and the shrinkage rate in the thickness of the formed first insulating layer were measured. In addition, the deposition thickness, uniformity, deposition rate per minute, reflective index(R.I), planarity, and conformality were also measured.

The results showed the following: a low stress variation rate of 1.3 to 1.4% at a high temperature of 420° C.; a high stress variation rate of 17 to 24% and a low thickness shrinkage rate of about 0.5% at a high temperature of 420° C.; and very low thickness shrinkage rate within 0.2% at the temperature of 360° and 390° C. When the TEOS volumetric flow rate of 1.3 slpm and the deposition temperature of 360° and 420° C. were given, the shrinkage rates of the first insulating layer according to the $O_3$ concentration were as follows.

For the deposition temperature of 360° C. and the $O_3$ mass density of 70 g/m$^3$, 100 g/m$^3$, and 130 g/m$^3$, the shrinkage rates were 1.60, 1.23, and 1.86%, respectively. In addition, for the deposition temperature of 420° C. and the $O_3$ mass density of 70 g/m$^3$, 100 g/m$^3$, and 130 g/m$^3$, the shrinkage rates were 0.35, 0.12, and 0.52%, respectively. Thus, when the $O_3$ mass density of 130 g/m$^3$ was given, the variation rate showed a comparatively high value.

From the above results, in the case where the mass density of $O_3$ is 130 g/m$^3$, it is determined that the formed layer is porous because of the large quantity of moisture present in the layer. As the composition atoms of the insulating layer are more densely combined, it shows superior physical properties. Accordingly, a mass density of $O_3$ of 130 g/m$^3$ is excluded from the most appropriate range of the present invention.

In addition, in order to determine the appropriate volumetric flow rate of TEOS gas for the deposition temperature of 390° C., the $O_3$ density of 100 g/m$^3$, and the TEOS flow rate of 1.3, 2.3, and 3.3 slpm, the thickness shrinkage rates were 0.52, 1.20, and 1.50%, respectively. This result shows that TEOS concentrations of 2.3, 3.3 slpm are more porous than that of TEOS concentration of 1.3 because the former have a larger quantity of moisture present than the latter. As the composition atoms of the insulating layer are densely combined, it shows superior physical properties. More accordingly, the cases of 2.3 and 3.3 slpm are excluded from the appropriate range of volumetric flow rate of TEOS for the present invention.

Most specimens actually used in carrying out the above example of the invention were around there thickness of 6,000 Å. The uniformity were the values of 0.89 to 2.59%. The deposition rate was the highest value in the case of the deposition temperature of 390° C., the TEOS volumetric flow rate of 3.3 slpm, the $O_3$ density (concentration) of 100 g/m$^3$ (4.66 mol wt %). Reflective index as of when the first insulating layer was deposited was nearly the same as that after a 30 minute annealing. Planarity is nearly the same and the value is a maximum when the deposition temperature is 420° C. Conformality ranges from 10 to 41% and the value is a maximum when the deposition temperature of 420° C. In addition, the TEOS volumetric flow rate of 1.3 slpm and $O_3$ density (concentration) of 100 g/m$^3$ (4.66 mol wt %) were given.

Figure 2:
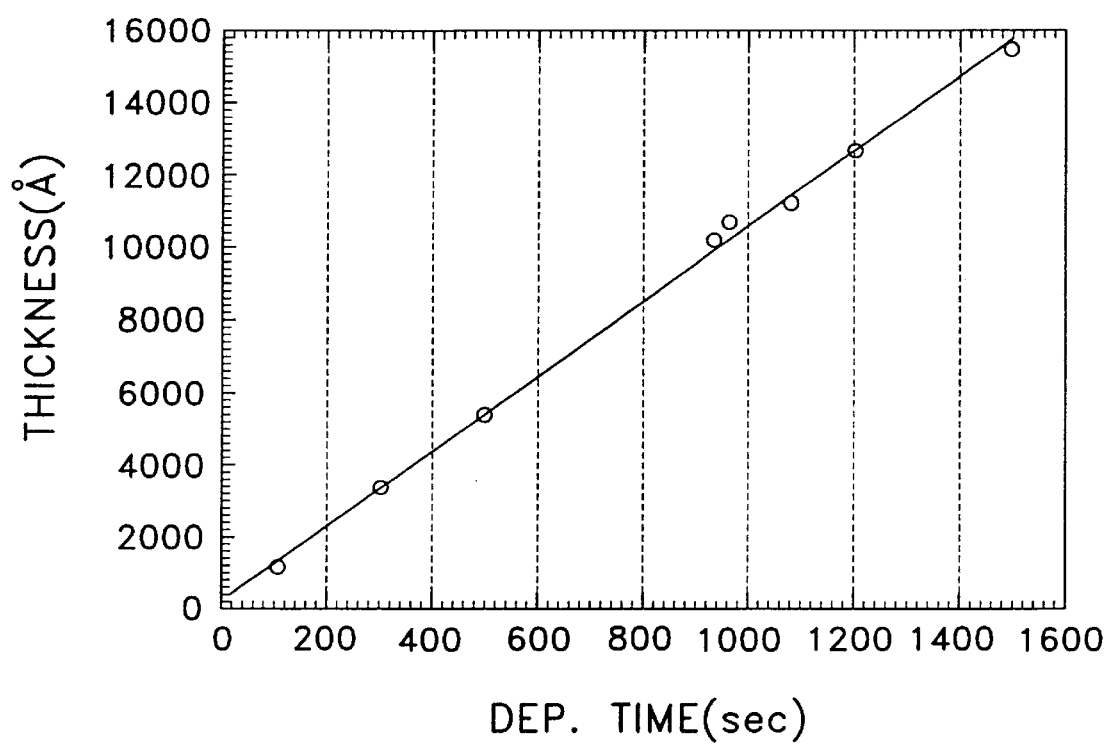
FIG. 2 is a graph showing variation of film thickness according to the deposition time when the forming temperature of 390° C., volume flow rate of TEOS gas of 1.3 slpm, and mass density of $O_3$ of 130 g/m³ are given.

FIG. 2 is a graph showing variation of film thickness according to the deposition time when the forming temperature is 390° C., the TEOS flow rate is 1.3 slpm, and the density of $O_3$ is 130 g/m$^3$.

As shown in FIG. 2, the deposition thickness linearly increased according to the increase of the deposition time. From this result, it is determined that the deposition time necessary to obtain the thickness of 6,000 Å or more, is at least 560 seconds or more.

Figure 3:
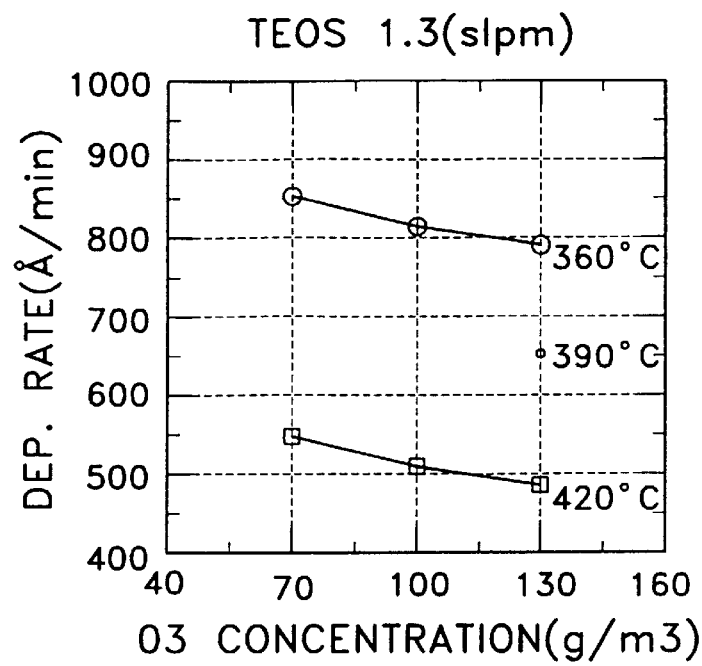
FIG. 3 is a graph showing the deposition rate of the deposited film when the volume flow rate of TEOS gas is fixed at 1.3 slpm and the concentration of $O_3$ is varied according to the forming temperature.

FIG. 3 is a graph showing the deposition rate of the deposited film when the flow rate of TEOS is fixed at 1.3 slpm and the concentration of $O_3$ is varied according to the forming temperature.

As shown in FIG. 3 as the $O_3$ concentration increased, the deposition rates per minute were decreased. Moreover, it shows that the deposition rates at high temperature were lower than those at low temperature within the given temperature range.

Figure 4:
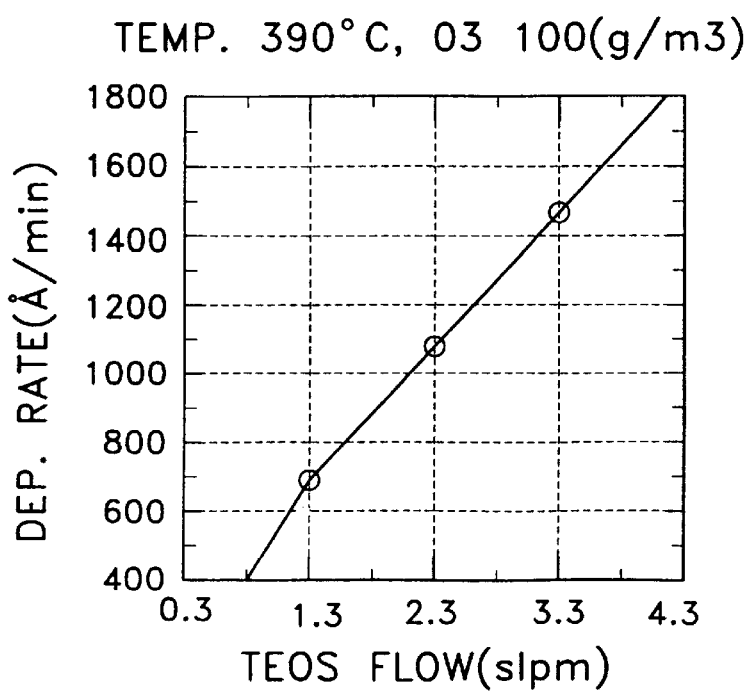
FIG. 4 is a graph showing the deposition rate of TEOS film according to the volume flow rate of TEOS gas.

FIG. 4 is a graph showing the deposition rate of TEOS film according to the TEOS volumetric flow rate. As shown in FIG. 4, as the flow rate of TEOS was Increased, the deposition rate was linearly increased.

Figure 5:
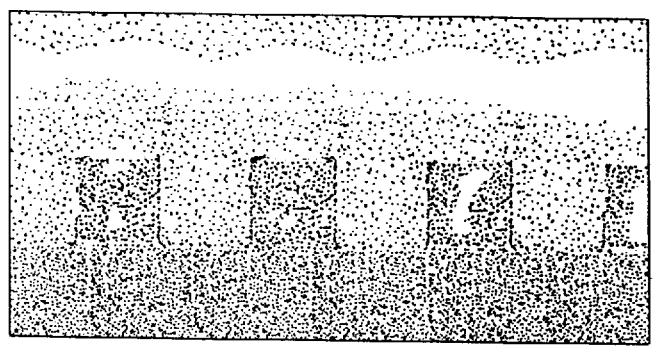
FIG. 5 is SEM micrograph of the semiconductor device in which the intermetallic insulating layers are formed according to an the embodiment of the present invention.

FIG. 5 is an SEM micrograph of a semiconductor device similar to that shown in FIG. 1A in which the intermetallic insulating layers are formed according to an embodiment of the present invention.

As shown in this figure, there is shown no indication of any generation of voids or pores in the first insulating layer. Thus, it is determined that the moisture component or hydrogen radicals have not penetrated in the formed layer, as was the case in the conventional art.

As previously described in detail, the intermetallic insulating layers of the present invention consist of two layers which have different properties from each other. In addition they not only have the physical properties of the appropriate range, but they also can prevent the penetration of moisture. Accordingly, the invention can minimize the generation of voids and the variation of the stress which acts as the major source of failure and unreliability in semiconductor devices. In addition, the present invention provides an effect of not only depressing the generation of voids but of also increasing the fabrication yield because the two insulating layers are formed in the same furnace.

Other features, advantages and embodiment of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A method of forming an intermetallic insulating layer in a semiconductor device comprising the steps of:

forming metal interconnects on a semiconductor substrate;

forming a first insulating layer to a first thickness capable of filling spaces between the metal interconnects by reacting tetraethylorthosilicate (TEOS) gas of a first flow rate with $O_3$ gas of a selected density in a chemical vapor deposition furnace; and forming in the furnace a second insulating layer of a second thickness on the first insulating layer by changing only the flow rate of TEOS to a second flow rate compared with the first flow rate for forming the first insulating layer.

2. The method in accordance with claim 1, wherein said first insulating layer is formed with the $O_3$ gas of the select density of 70 to 130 g/m$^3$, a deposition temperature of 360° to 420° C., and the first flow rate of TEOS between 1.0 and 2.0 slpm.

3. The method in accordance with claim 1, wherein said second insulating layer is formed with the $O_3$ gas of the select density of 70 to 130 g/m$^3$, a deposition temperature of 360° to 420° C., and the second flow rate of TEOS of less than 0.5 slpm.

4. The method in accordance with claim 1, wherein the thickness of said first insulating layer is 6,000 Å or higher, and of said second insulating layer is 1,000 Å or lower.

5. The method in accordance with claim 2, wherein said second insulating layer is formed with the $O_3$ gas of the selected density of 70 to 130 g/m$^3$, a deposition temperature of 360° to 420° C., and the second flow rate of TEOS of less than 0.5 slpm.

6. The method in accordance with claim 5, wherein the thickness of said first insulating layer is 6,000 Å or higher, and of said second insulating layer is 1,000 Å or lower.

7. The method in accordance with claim 2, wherein the thickness of said first insulating layer is 6,000 Å or higher, and of said second insulating layer is 1,000 Å or lower.

8. The method in accordance with claim 3, wherein the thickness of said first insulating layer is 6,000 Å or higher, and of said second insulating layer is 1,000 Å or lower.

* * * * *

UNITED STATES PATENT AND TRADEMARK OFFICE
CERTIFICATE OF CORRECTION

PATENT NO. : 5,804,509  
DATED : September 8, 1998  
INVENTOR(S) : G. CHO

Page 1 of 3

It is certified that error appears in the above-identified patent and that said Letters Patent is hereby corrected as shown below:

Title page, item [57], line 6, please cancel "," after " interconnects are".

At column 1, line 5, please cancel "SUMMARY" and substitute --FIELD-- therefor; and at line 60, after "Tetraethylorthosilicate gas", please cancel "of" and substitute --at-- therefor.

At column 2, line 5, after "TEOS", please cancel ",";
    at lines 7-10, please cancel "Physical properties. Accordingly, a mass density of $O_3$ of 130 g/m$^3$ is excluded from the most appropriate range." and substitute new text as follows:
    --These and other objects, features and advantages of the present invention will become more apparent in light of the detailed description of a best mode embodiment thereof, as illustrated in the accompanying drawing.--;

at line 33, please cancel "the" prior to "embodiment" and substitute --an-- therefor; and at line 39, please insert --and-- prior to "scope".

UNITED STATES PATENT AND TRADEMARK OFFICE
CERTIFICATE OF CORRECTION

PATENT NO. : 5,804,509
DATED : September 8, 1998
INVENTOR(S) : G. CHO

It is certified that error appears in the above-identified patent and that said Letters Patent is hereby corrected as shown below:

At column 3, line 66, please cancel "concentrations" and substitute --flow rates-- therefor; and at line 67, please cancel "concentration" and substitute --flow rates-- therefor.

At column 4, line 2, please insert --more-- prior to "densely";

at line 3, please cancel "More";

at line 4, please cancel "accordingly" and substitute --Accordingly--;

at line 8, please cancel "there" and substitute --a-- therefor;

at line 43, please cancel "Increased" and substitute --increased-- therefor; and at line 55, please cancel "consist of" and substitute --comprise--.

UNITED STATES PATENT AND TRADEMARK OFFICE
CERTIFICATE OF CORRECTION

PATENT NO. : 5,804,509
DATED : September 8, 1998
INVENTOR(S) : G. CHO

It is certified that error appears in the above-identified patent and that said Letters Patent is hereby corrected as shown below:

At column 5, line 23 (claim 2, line 2), please cancel "select" and substitute --selected-- therefor.

At column 6, line 3 (claim 3, line 3), please cancel "select" and substitute --selected-- therefor.

Signed and Sealed this

Second Day of February, 1999

Attest:

*Attesting Officer*

*Acting Commissioner of Patents and Trademarks*